United States Patent
Avanic et al.

(10) Patent No.: US 6,188,287 B1
(45) Date of Patent: Feb. 13, 2001

(54) METHOD AND APPARATUS FOR REDUCING PHASE NOISE IN A VOLTAGE CONTROLLED OSCILLATOR CIRCUIT

(75) Inventors: Branko Avanic, Miami; John K. McKinney, Plantation; Frank A. Poggiali, Lauderhill, all of FL (US)

(73) Assignee: Motorola, Inc., Schaumburg, IL (US)

( * ) Notice: Under 35 U.S.C. 154(b), the term of this patent shall be extended for 0 days.

(21) Appl. No.: 09/406,432

(22) Filed: Sep. 27, 1999

(51) Int. Cl.[7] .............................. H03L 7/085; H03L 7/099
(52) U.S. Cl. .................. 331/11; 331/16; 331/17; 331/25; 331/177 R; 331/177 V
(58) Field of Search .................. 331/17, 16, 10, 331/11, 25, 177 R, 177 V

(56) References Cited

U.S. PATENT DOCUMENTS

| | | | |
|---|---|---|---|
| 4,156,204 | 5/1979 | Hargis | 331/12 |
| 4,270,098 | 5/1981 | Bowman | 331/96 |
| 4,270,213 | 5/1981 | Falk et al. | 455/77 |
| 4,336,505 | * 6/1982 | Meyer | 331/1 R |
| 4,454,483 | 6/1984 | Baylor | 331/11 |
| 4,574,243 | 3/1986 | Levine | 328/155 |
| 4,590,602 | 5/1986 | Wolaver | 375/120 |
| 4,609,884 | 9/1986 | Kindinger et al. | 331/109 |
| 4,714,899 | 12/1987 | Kurtzman et al. | 331/1 A |
| 4,764,737 | 8/1988 | Kaatz | 331/1 A |
| 4,975,650 | 12/1990 | Martin | 328/133 |
| 5,059,927 | * 10/1991 | Cohen | 331/77 |
| 5,382,921 | 1/1995 | Estrada et al. | 331/1 A |
| 5,389,898 | 2/1995 | Taketoshi et al. | 331/2 |
| 5,604,465 | 2/1997 | Farabaugh | 331/10 |
| 5,686,864 | 11/1997 | Martin et al. | 331/1 A |
| 6,091,303 | * 7/2000 | Dent | 331/2 |

* cited by examiner

Primary Examiner—Siegfried H. Grimm
(74) Attorney, Agent, or Firm—Barbara R. Doutre

(57) ABSTRACT

A phase noise optimization circuit (208) minimizes phase noise for a voltage controlled oscillator (VCO) (202). Control circuitry (214) locates a minimum phase noise region for VCO operation based on the slope of the VCO's changing control voltage (206) versus changing bias voltage (204) for a bias voltage range. The control circuitry (214) then adjusts the bias input so that the VCO operates in a region of minimum phase noise.

16 Claims, 5 Drawing Sheets

300

METHOD AND APPARATUS FOR REDUCING PHASE NOISE IN A VOLTAGE CONTROLLED OSCILLATOR CIRCUIT

TECHNICAL FIELD

This invention relates to voltage controlled oscillator circuits, and more particularly to the optimization of phase noise in such circuits.

BACKGROUND

Many of today's communications devices, such as radios, utilize voltage controlled oscillator (VCO) circuits. Phase noise is one of the most important parameters to be considered in the design of oscillator circuits, because it has a great impact on the overall operating performance of the radio. Several techniques exist for optimizing phase noise performance, however, these techniques tend to test/tune the VCO as a stand-alone circuit. Once the VCO is implemented in a transceiver, such as within a phase locked loop (PLL) circuit, the operating characteristics may vary considerably from the previously tuned settings, thus requiring another tuning process. The VCO circuit can end up operating under less than optimal conditions. For some products the feasibility of implementing an additional tuning procedure at the transceiver stage is simply impractical or cost prohibitive.

FIG. 1 shows a graph 100 depicting an example of phase noise 102 vs. current 104 for two given control voltages 106, 108 for a single VCO, such as would operate in a PLL. Curve 106 represents a response for a first control voltage, such as might correspond to channel one of a radio. The optimized phase noise performance for this channel is in the region indicated by designator 110 which corresponds to a particular input current 112. This current now remains fixed across the band. As the radio channel is changed, to channel two for instance, a new control voltage becomes associated with this new channel as indicated by curve 108. The phase noise performance thus varies from the nominal setting indicated by designator 110 to that indicated by designator 114. As seen from the graph 100, considerable phase noise degradation occurs across the band. Graph 100 demonstrates that the VCO can only be truly optimized for a single control voltage, channel, and frequency setting.

Many product lines require additional VCO bandsplits in order to cover a large frequency band. However, these additional bandsplits translate into additional product and manufacturing costs, because separate VCO circuits are needed to cover each band. Alternatively, the total number of VCO bandsplits can be reduced to cover the same total frequency band. This compromise often results in VCOs having reduced performance specifications. It would be desirable to have a single VCO circuit capable of being tuned to operate in more than one bandsplit. In addition, the capability of tuning at the product level as opposed to the stand alone circuit level would further reduce overhead, cost, and time.

Accordingly, there is a need for an improved method and apparatus of optimizing phase noise performance in a VCO circuit.

DETAILED DESCRIPTION OF THE PREFERRED EMBODIMENT

Figure 1:
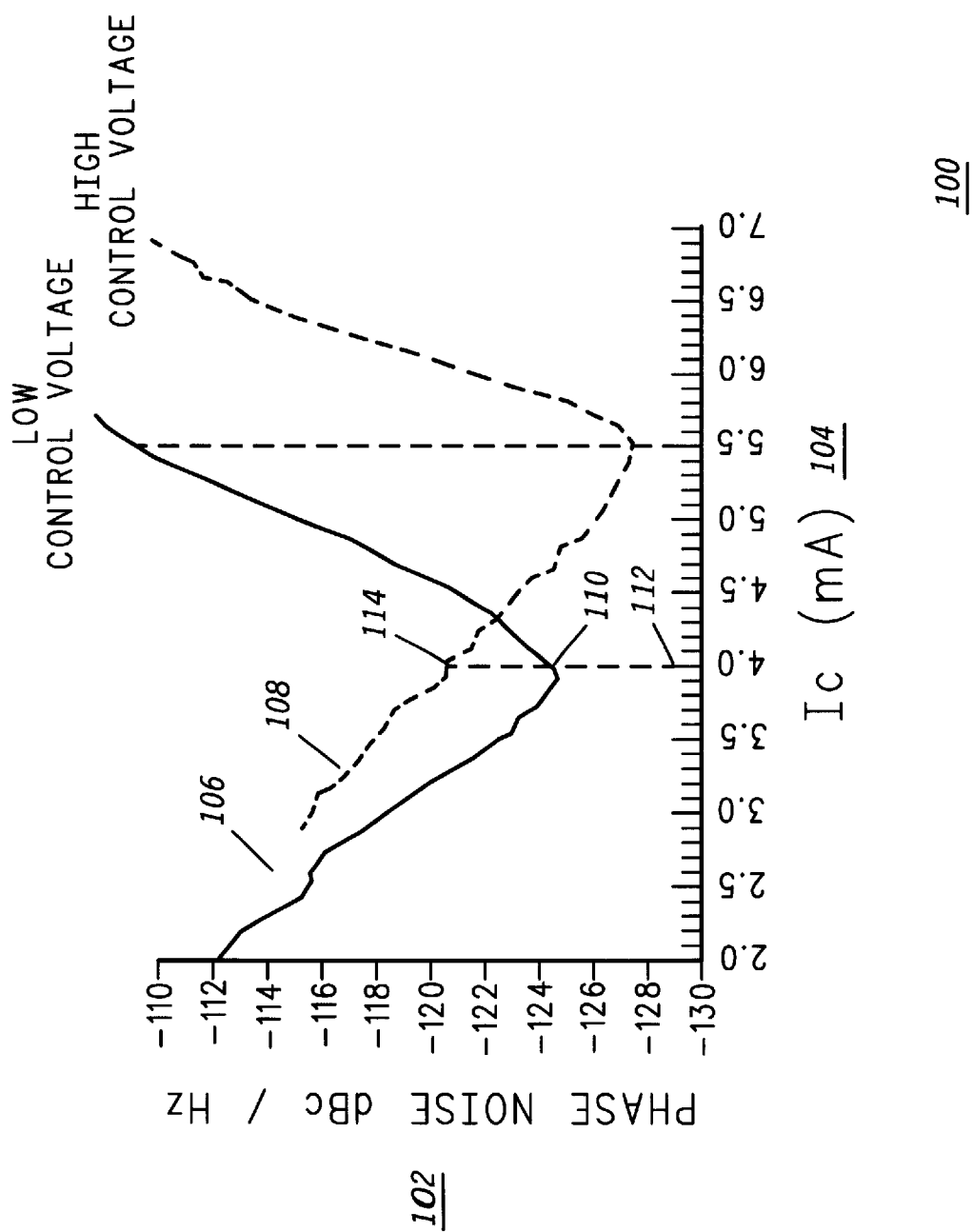
FIG. 1 is a graph of phase noise vs. current vs. control voltage for a typical voltage controlled oscillator circuit.

While the specification concludes with claims defining the features of the invention that are regarded as novel, it is believed that the invention will be better understood from a consideration of the following description in conjunction with the drawing figures, in which like reference numerals are carried forward.

Briefly, in accordance with the present invention, a continuous real time approach to optimizing phase noise in a VCO is described herein. In accordance with the invention, a real time approach adaptively changes the bias conditions of the oscillator for operation within the minimum phase noise region. Additionally, the phase noise optimization approach to be described herein optimizes the VCO for more than one channel frequency (i.e. control voltage) within the band.

Figure 2:
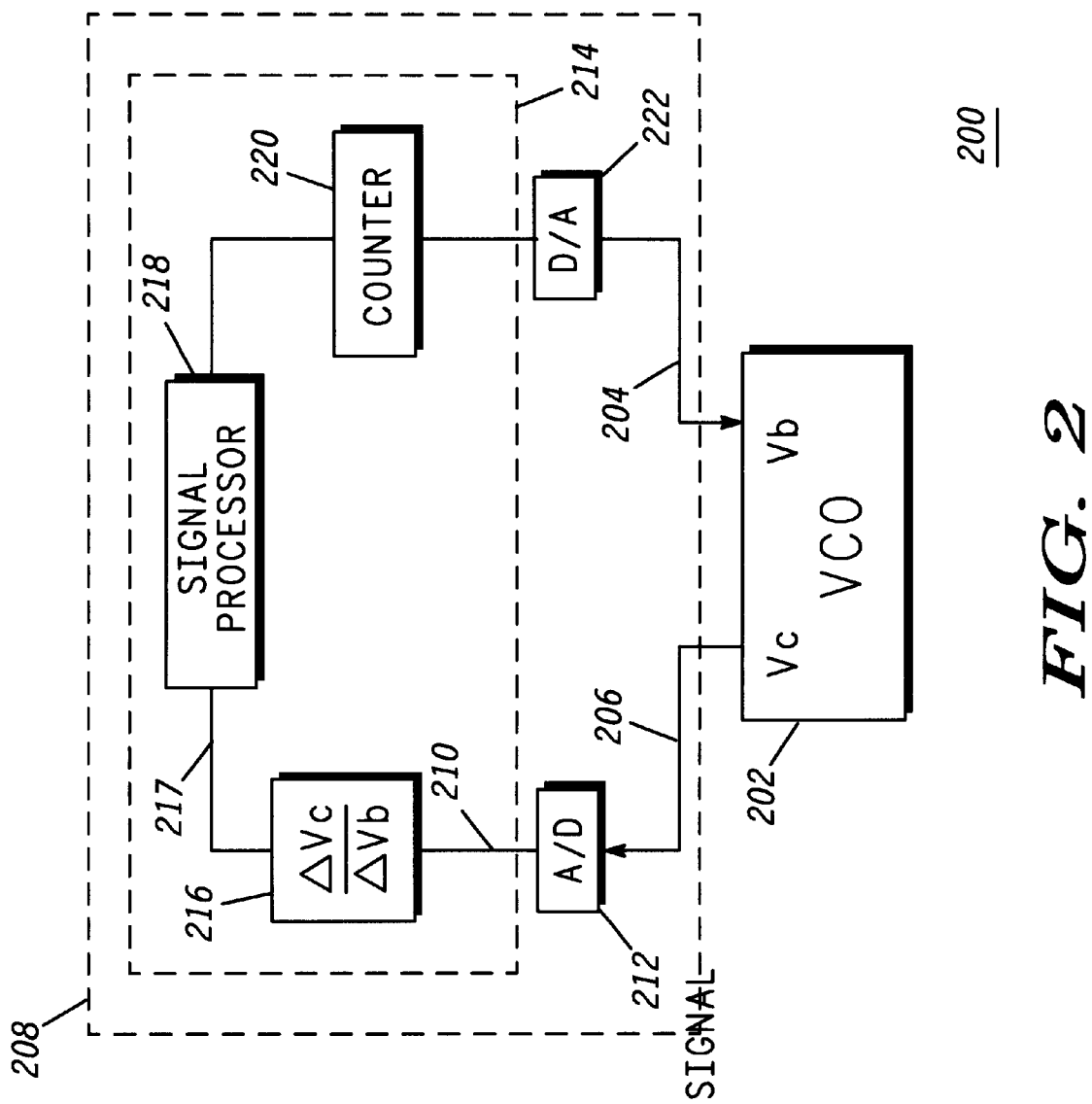
FIG. 2 is a block diagram of a VCO utilizing a phase noise optimization circuit in accordance with the present invention.

FIG. 2 is a simplified block diagram 200 of a VCO utilizing a phase noise optimization circuit 208 in accordance with the present invention. Voltage controlled oscillator circuit 202 can be formed from a variety of oscillator circuits known or yet to come, including, but not limited to Colpitts, Clapp, Hartley, and any negative resistance type oscillators. VCO 202 receives a bias input, Vb, 204 for optimizing the phase noise of the local oscillator. External PLL circuitry (not shown) generates a control voltage, Vc, 206 with which to steer the VCO. In accordance with the present invention, a phase noise optimization circuit 208 is coupled across the VCO's bias input, Vb, 204 and its control voltage, Vc, 206.

The phase noise optimization circuit 208 of the present invention taps the control voltage 206 and converts it to a digital signal 210, preferably through an analog-to-digital converter, A/D, 212. In accordance with the present invention, the digital signal 210 is processed through control circuitry 214, preferably a microprocessor or similar control device, including a slope determination circuit 216, a signal processor 218, and a counter 220. The slope determination circuit 216 is preferably implemented using real time signal processing methods and/or hardware implementations of logic circuitry. In accordance with the present invention, the slope determination circuit 216 determines the derivative of the digitized control voltage signal with respect to the bias input signal, Vb, over a predetermined bias voltage range, producing a slope signal 217. In accordance with the invention, the slope 217 is used to represent a region of minimum phase noise operation in the VCO circuit 200. The slope is then analyzed in the signal processor 218. If an appropriate minimum phase noise region is determined at signal processor 218 then the operation of the VCO is maintained with the current bias voltage setting. If an unsatisfactory phase noise region is encountered, a counter 220 adjusts the bias voltage, Vb, preferably through a digital-to-analog, D/A, converter 222. In accordance with the present invention, an appropriate phase noise level is thus achieved by adjusting the VCO bias voltage in response to the slope 217 of the VCO bias input and VCO control voltage. Thus, an optimized bias setting is determined which can, if desired, be stored in memory so that upon turning on or changing channels the biasing starts on a previously stored optimized setting.

Figure 3:
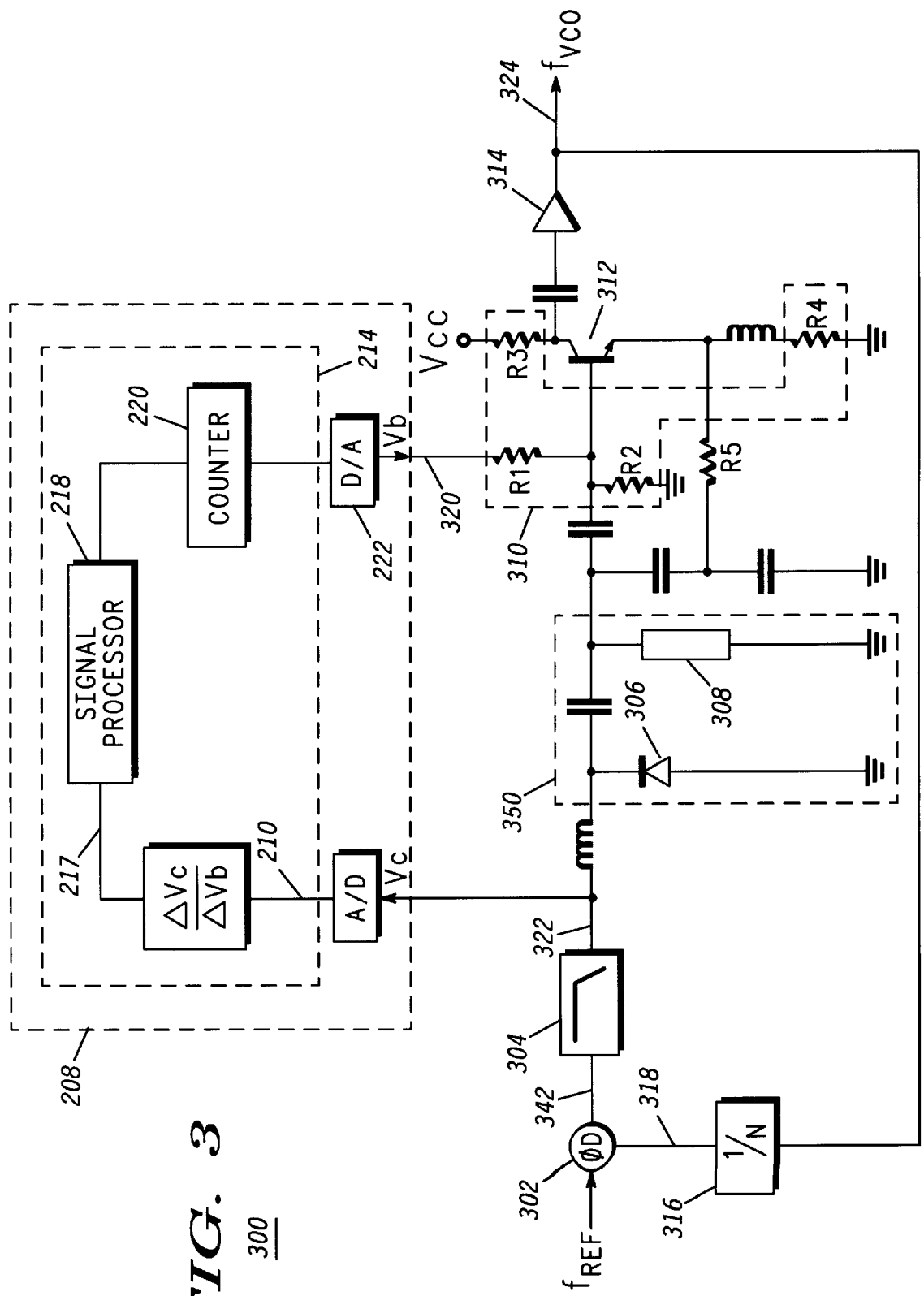
FIG. 3 is a block diagram of a phase lock loop utilizing a phase noise optimization circuit in accordance with the present invention.

Referring now to FIG. 3, there is shown a phase lock loop 300 utilizing the phase noise optimization circuit 208 in accordance with the present invention. Phase lock loop 300 includes, generally, a phase detector 302, loop filter 304, VCO tank circuit 350, bias circuitry 310, an active device 312, VCO buffer 314, and feedback divider/pre-scalar 316. VCO tank circuit 350 preferably includes a varactor 306 and resonant element 308. PLL 300 receives an input frequency (fref), typically generated from a crystal oscillator, which is phase compared to a divided feedback frequency 318. An error voltage 342 is generated based on the phase difference between the reference frequency and the divided feedback frequency 318. The error voltage 342 is filtered through the loop filter 304 to filter out noise and produce a control voltage, Vc 322. The control voltage, Vc, 322 steers the VCO using tank circuit 350, while a bias input voltage, Vb, 320 biases the bias circuitry 310 for the VCO active device 312. Here, the bias is shown as a base bias but other biasing configurations of the active device could also be used. The active device 312 is shown as a bipolar transistor, but may also be implemented with a field effect transistor as well, or other suitable semiconductor device. The output generated by the active device 312 is amplified by VCO buffer 314 to produce a local oscillator frequency, fvco, 324.

In accordance with the present invention, phase noise optimization circuit 208 is coupled across the control voltage 322 and bias voltage input 320. Phase noise optimization circuit 208 converts the control voltage 322 into the digital signal 210. In accordance with the present invention, the digital signal 210 is processed through control circuitry 214 which determines the slope of the control voltage signal versus the bias signal. The slope is preferably measured in incremental steps over a predetermined bias voltage range to determine the characteristic slope of the phase noise. In accordance with the present invention, the phase noise optimization control circuit 208 verifies the region in which the optimum phase noise falls by finding a minimum in the curve of 217 through slope reversal methods utilized in signal processor 218. If the slope 217 does not fall within a desired region, counter 220 is incremented/decremented to adjust the bias signal. The digital-to-analog (D/A) converter 222 converts the digitized bias signal into the analog bias input 320 used to bias the VCO active device 312, thus both shifting the VCO operating frequency as well as presenting a new bias condition for device 312. The adjusted frequency is fed back through the divider 316 and compared with the reference frequency at phase detector 302 to produce the error voltage 342, which once filtered through the loop filter 304 becomes the new control voltage 322.

Figure 4:
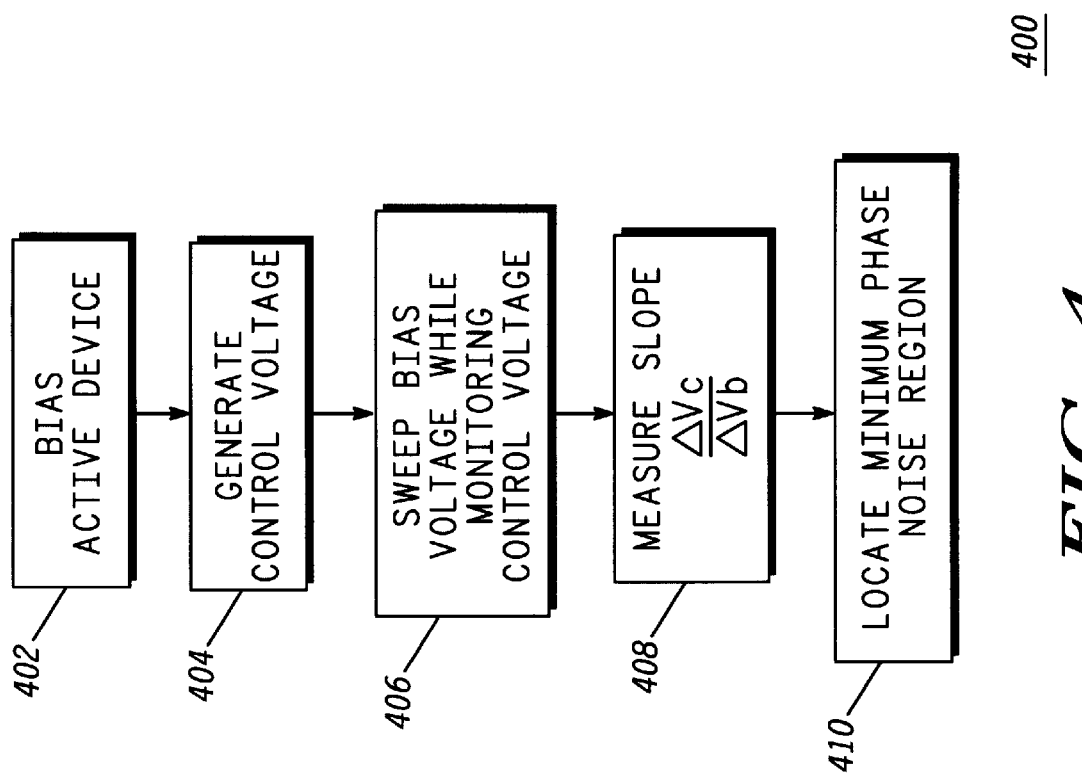
FIG. 4 is a flowchart of a method for optimizing phase noise in a VCO in accordance with the present invention.

FIG. 4 is a flowchart depicting a technique 400 for reducing phase noise in a VCO circuit in accordance with the present invention. Technique 400 begins by biasing the VCO's active device with a bias voltage at step 402, external PLL circuitry generates the control voltage in response thereto at step 404. In accordance with the present invention, step 406 sweeps the bias voltage over a predetermined bias voltage range while monitoring the control voltage. In accordance with the invention, step 408 then measures the slope of the control voltage (Vc) relative to the bias voltage (Vb) to represent a phase noise region within the swept range. Finally, the step of locating a minimum phase noise region based on the slope is performed at step 410.

The VCO can now be operated within the minimum phase noise region for optimum phase noise performance. The step of locating the minimum phase noise region 410 can be accomplished by determining the minimum slope within the swept range, or alternatively, by determining a slope reversal or inflection point within the swept range (e.g. checking for a transition from a negative-to-positive or positive-to-negative slope).

Figure 5:
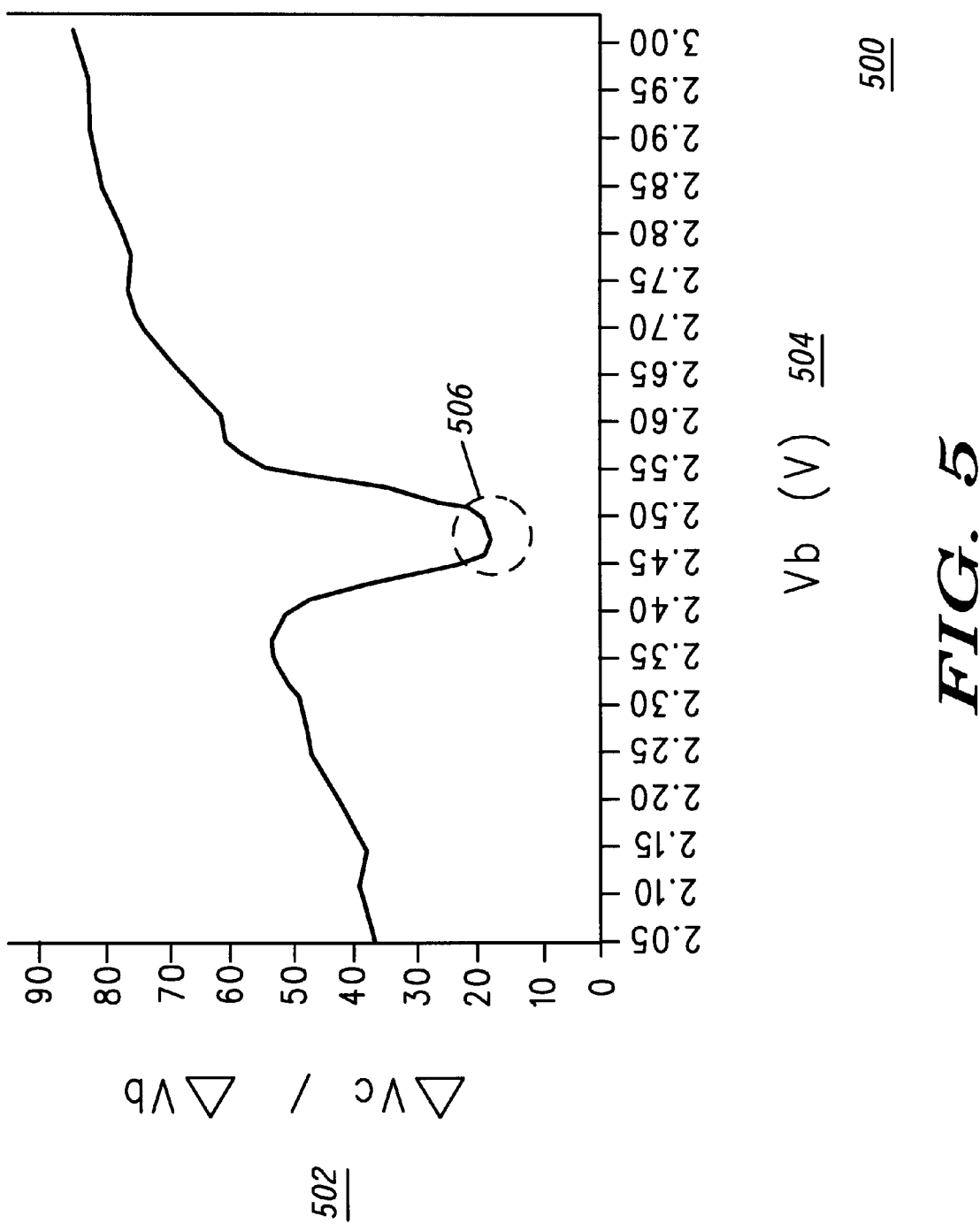
FIG. 5 is a graph of an example of slope conditions measured by the change in control voltage versus change in bias voltage ($\Delta Vc/\Delta Vb$) for a predetermined bias voltage range (Vb) for a given radio channel in accordance with the present invention.

FIG. 5 is a graph of an example of slope conditions measured by the change in control voltage versus change in bias voltage ($\Delta Vc/\Delta Vb$) 502 for a predetermined bias voltage range (Vb) 504 for a given radio channel from a radio whose PLL/VCO was formed in accordance with the present invention. Thus, $$\text{Slope} = (\Delta Vc/\Delta Vb) \text{ vs. Vb}$$

Graph 500 shows that VCO minimum phase noise operation is achieved by setting the bias voltage at approximately 2.45 to 2.50 volts for this channel. Determining the minimum phase noise region based on a minimum slope value or slope reversal allows for optimized phase noise operation in the region denoted by designator 506.

Accordingly, there has been provided a PLL that provides control circuitry between the VCO's bias input and control voltage signal in order to estimate the slope of these two parameters, and the bias voltage being adjusted so that the VCO operates in a minimum phase noise region. The location of minimum phase noise operation is achieved by first sweeping the VCO's active device with a bias voltage, the PLL thereby responding by generating a control voltage to steer the VCO, and finally, the logic circuitry determining the slope of the control voltage versus the bias voltage to locate the minimum phase noise region of operation for the VCO.

Improved phase noise performance is a desirable trait for any VCO transceiver whether used in portable, mobile, or stationary communication devices. Optimized VCO phase noise performance can now be automatically achieved at every channel while the VCO is locked in a phase lock loop within a communication device's bandsplit of interest without tuning. Using the phase noise optimization circuit and technique of the present invention provides a single VCO circuit, or fewer VCO circuits, to cover the same frequency range as that of multiple band splitted VCOs of the past.

Numerous modifications, changes, variations, substitutions and equivalents will occur to those skilled in the art without departing from the spirit and scope of the present invention as defined by the appended claims.

What is claimed is:

1. A phase noise optimization circuit for a voltage controlled oscillator (VCO), comprising:
   a VCO circuit receiving a bias voltage input and a control voltage input;
   control circuitry coupled to the VCO for determining the slope of the control voltage versus bias voltage input for a predetermined bias voltage input range; and
   the control circuitry adjusting the bias voltage input in response to the slope.

2. The phase noise optimization circuit as described in claim 1, wherein the VCO comprises a Hartley VCO.

3. The phase noise optimization circuit as described in claim 1, wherein the VCO comprises a Colpitts VCO.

4. The phase noise optimization circuit as described in claim 1, wherein the VCO comprises a Clapp VCO.

5. The phase noise optimization circuit as described in claim 1, wherein the VCO comprises a negative resistance VCO.

6. A method of reducing phase noise in a voltage controlled oscillator(VCO), comprising the steps of:

biasing an active device with a bias voltage (Vb); applying a control voltage (Vc) to the VCO;

determining a slope based on changing control voltage versus changing bias voltage (ΔVc/ΔVb)for a predetermined bias voltage range(Vb); and locating a minimum phase noise region based on the slope determined within the predetermined bias voltage range.

7. A method of minimizing phase noise in a voltage controlled oscillator (VCO) of a PLL which includes an active device having a base, comprising the steps of:

biasing the base of the active device with a bias voltage;

generating a control voltage from the PLL in response to the base bias voltage biasing the active device;

sweeping the base bias voltage while monitoring the control voltage over a predetermined bias voltage range;

measuring a slope of the control voltage versus the base bias voltage over the swept bias voltage in order to represent phase noise within the swept bias voltage range; and locating a minimum phase noise region based on the slope.

8. The method of claim 7, wherein the step of locating includes the step of determining the minimum slope within the swept range.

9. The method of claim 7, wherein the step of locating includes the step of determining a slope reversal within the swept range.

10. A method of minimizing phase noise in a voltage controlled oscillator (VCO) having an active device, comprising the steps of:

applying a bias voltage to the active device;

generating a VCO output frequency signal in response to the bias voltage;

dividing the VCO output frequency into a divided signal;

comparing the divided VCO output frequency to a reference frequency thereby detecting a phase error within the divided signal;

generating a DC voltage based on the phase error;

filtering the DC voltage to provide a VCO control voltage;

taking a derivative of the VCO control voltage versus the bias voltage over a predetermined bias voltage range; and locating a minimum phase noise region based on the derivative.

11. The method of claim 10, further comprising the step of adjusting the bias voltage for VCO operation within the minimum phase noise region.

12. A method of minimizing phase noise of a VCO having an active device operating within a phase lock loop (PLL), comprising the steps of:

sweeping the active device with a bias voltage;

generating a control voltage within the PLL to steer the VCO in response to the active device being swept; and determining the slope of the control voltage versus the bias voltage over the swept bias voltage in order to locate a region of minimum phase noise operation for the VCO.

13. The method of claim 12 further comprising the step of storing the bias voltage from within the swept bias voltage range that provides the minimum phase noise region.

14. A voltage controlled oscillator, including:

an active device for receiving an input bias voltage and generating a VCO output frequency;

a divider for dividing the VCO output frequency into a divided VCO output frequency;

a phase detector for comparing a reference frequency to the divided VCO output frequency thereby producing an error voltage;

a loop filter for filtering the error voltage and generating a control voltage, the control voltage for steering the VCO; and control circuitry for determining the slope of the control voltage versus the input bias voltage over a predetermined bias voltage range, the slope for estimating a minimum phase noise region of operation for the VCO.

15. A radio, including:

a phase lock loop (PLL) circuit, having:

a voltage controlled oscillator (VCO) circuit receiving a bias input;

a divider coupled to the VCO;

a phase detector coupled to the divider;

a loop filter coupled to the phase detector, the loop filter generating a control voltage signal; and logic circuitry coupled across the control voltage signal and bias voltage input of the VCO, the logic circuitry estimating a minimum phase noise region based on a slope of the changing control voltage over changing bias voltage for a predetermined bias voltage range.

16. The radio of claim 15, wherein the logic circuitry adjusts the bias voltage in response to the slope in order to operate the VCO in a predetermined minimum phase noise region.

* * * * *